(12) United States Patent
Sanchez et al.

(10) Patent No.: US 7,256,657 B2
(45) Date of Patent: Aug. 14, 2007

(54) VOLTAGE CONTROLLED OSCILLATOR HAVING DIGITALLY CONTROLLED PHASE ADJUSTMENT AND METHOD THEREFOR

(75) Inventors: Hector Sanchez, Cedar Park, TX (US); Zhonghai Shi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 60 days.

(21) Appl. No.: 11/251,467

(22) Filed: Oct. 14, 2005

(65) Prior Publication Data

US 2007/0085624 A1   Apr. 19, 2007

(51) Int. Cl.
H03L 7/00 (2006.01)
(52) U.S. Cl. .................. 331/34; 331/57; 331/177 R; 327/158; 327/159
(58) Field of Classification Search .............. 331/34, 331/177 R, 57; 327/158, 159
See application file for complete search history.

(56) References Cited

U.S. PATENT DOCUMENTS

| | | | |
|---|---|---|---|
| 4,872,010 A | 10/1989 | Larson et al. | |
| 5,144,170 A | 9/1992 | Parker | |
| 5,463,353 A | 10/1995 | Countryman et al. | |
| 5,675,341 A | 10/1997 | Vallancourt et al. | |
| 5,912,591 A | 6/1999 | Yamada | |
| 5,936,433 A | 8/1999 | Holloway | |
| 6,222,395 B1 | 4/2001 | Bertin et al. | |
| 6,462,527 B1 | 10/2002 | Maneatis et al. | |
| 6,677,569 B2 | 1/2004 | Beusch | |

(Continued)

OTHER PUBLICATIONS

Mathew et al, "Multiple Independent Gate Field Effect Transistor (MIGFET)—Multi-Fin RF Mixer Architecture, Three Independent Gates (MIGFET-T) Operation and Temperature Characteristics"; 2005 Symposium on VLSI Technology Digest of Technical Papers, pp. 200-201.

(Continued)

Primary Examiner—Arnold Kinkead
(74) Attorney, Agent, or Firm—Daniel D. Hill; Robert L. King

(57) ABSTRACT

A VCO has a plurality of MIGFETs coupled to provide phase adjustment in response to receiving digital phase adjustment control signals. The VCO includes a ring oscillator implemented as a plurality of serially coupled inverters. A phase adjustment circuit is coupled to the output of each inverter. The phase adjustment circuit of each stage comprises a predetermined number of MIGFETs. In one embodiment, half of the MIGFETs are used to speed-up the phase/frequency of the OUTPUT signal a predetermined amount in response to receiving speed-up control signals. The other half of the MIGFETs are used to slow-down the phase/frequency of the OUTPUT signal a predetermined amount in response to the receiving slow-down control signals. The VCO requires relatively less surface area, is simple, and is easy to implement.

20 Claims, 3 Drawing Sheets

U.S. PATENT DOCUMENTS

| | | |
|---|---|---|
| 6,720,812 B2 | 4/2004 | Tumer et al. |
| 6,756,826 B1 | 6/2004 | Klein et al. |
| 6,759,875 B2 | 7/2004 | Mano et al. |
| 6,774,733 B2 | 8/2004 | Arima |
| 6,842,136 B1 | 1/2005 | Agarwal et al. |
| 6,969,656 B2 * | 11/2005 | Du et al. .................... 438/268 |
| 6,972,702 B1 | 12/2005 | Moon |

OTHER PUBLICATIONS

Mathew et al; "CMOS Vertical Multiple Independent Gate Field Effect Transistor (MIGFET)"; SOI Conference 2004; 4 pp.

Leme et al.; "High Performance CMOS Comparator for Analogue-Digital Convertors"; Electronics Letters; Sep. 20, 1990; 2pp; vol. 26, Issue 20; IEEE.

Mathew et al; Abstract: "Multiple Independent Gate Field Effect Transistor (MIGFET)—Device, Process, Applications"; 207th ECS Conference; May 15-20, 2005, Quebec City, Canada, 1 pgs.

Mathew et al; "Multiple Independent Gate Field Effect Transistor (MIGFET)—Device, Process, Applications"; 207th ECS Conference; May 15-20, 2005, Quebec City, Canada, 10pg.

* cited by examiner

VOLTAGE CONTROLLED OSCILLATOR HAVING DIGITALLY CONTROLLED PHASE ADJUSTMENT AND METHOD THEREFOR

RELATED APPLICATIONS

A related application is entitled "Method and Circuit for Multiplying Signals With a Transistor Having More Then One independent Gate Structure", by Yang Du et al., application Ser. No. 10/728,621, now U.S. Pat. No. 6,969,656, assigned to Freescale Semiconductor, and was filed on Dec. 5, 2003.

A related application is entitled "Fully Programmable Phase Locked Loop", by Hector Sanchez et al., application Ser. No. 11/069,664, now U.S. Pat. No. 7,135,934, assigned to Freescale Semiconductor, and was filed on Mar. 1, 2005.

A related, copending application is entitled "Voltage Controlled Oscillator with a Multiple Gate Transistor and Method Therefor", by Sriram Kalpat et al., application Ser. No. 11/250,994, assigned to Freescale Semiconductor, and was filed concurrently herewith.

A related, copending application is entitled "Signal Converters With Multiple Gate Devices", by Mohamed Moosa et al., application Ser. No. 11/250,993, assigned to Freescale Semiconductor, and was filed concurrently herewith.

A related, copending application is entitled "Output Driver Circuit with Multiple Gate Devices", by Hector Sanchez, application Ser. No. 11/251,470, assigned to Freescale Semiconductor, and was filed concurrently herewith.

FIELD OF THE INVENTION

The present invention relates generally to electronic circuits, and more particularly, to a digitally controlled phase adjustment circuit for a voltage controlled oscillator (VCO).

BACKGROUND OF THE INVENTION

Voltage controlled oscillators (VCOs) generate a periodic clock signal in response to an input voltage. There are numerous applications for VCOs such as in tunable frequency generators. Additionally, VCOs are often used in phase locked loop (PLL) circuits to generate a clock signal that is dynamically phase and frequency compared to an input reference clock signal. To keep the generated clock signal aligned with the input reference clock, the phase difference is monitored and a phase correction circuit is used to change either the phase or the frequency (or both) of the generated clock signal to match the phase of the reference clock. Designers of VCOs have been faced with the problem of providing a relatively small and easy to implement phase correction circuit that will operate at low power supply voltages (e.g. 1.0–1.5 volts).

Therefore, it is desirable to provide an integrated circuit VCO having a phase correction circuit that is small and easy to implement.

DETAILED DESCRIPTION

Generally, the present invention provides, in one form, a VCO having a plurality of MIGFETs (multiple independent gate field-effect transistors) coupled to provide phase adjustment in response to receiving digital phase adjustment control signals. The VCO includes a ring oscillator implemented as a plurality of serially coupled inverters. A phase adjustment circuit is coupled to the output of each inverter. The phase adjustment circuit of each stage comprises a predetermined number of MIGFETs. A plurality of the MIGFETs is used to speed-up the phase/frequency of the OUTPUT signal a predetermined amount in response to receiving "UP" control signals. The rest of the MIGFETs are used to slow-down the phase/frequency of the OUTPUT signal a predetermined amount in response to the receiving "DN" control signal. In the illustrated embodiment, the MIGFETs are sized to provide a predetermined amount of drive current to the pull-up transistors of the inverters. In other embodiments, the MIGFETS may be coupled to provide a predetermined amount of drive current to the pull-down transistors of the inverters.

The disclosed VCO requires relatively less surface area, is simple, and is easy to implement. Also, as compared to prior art phase correction circuits, the disclosed VCO requires fewer conductors and fewer contacts, thus reducing resistance and simplifying the circuit. In addition, the phase adjustment circuits 70, 84, and 86 may provide a relatively greater range of phase correction.

Figure 1:
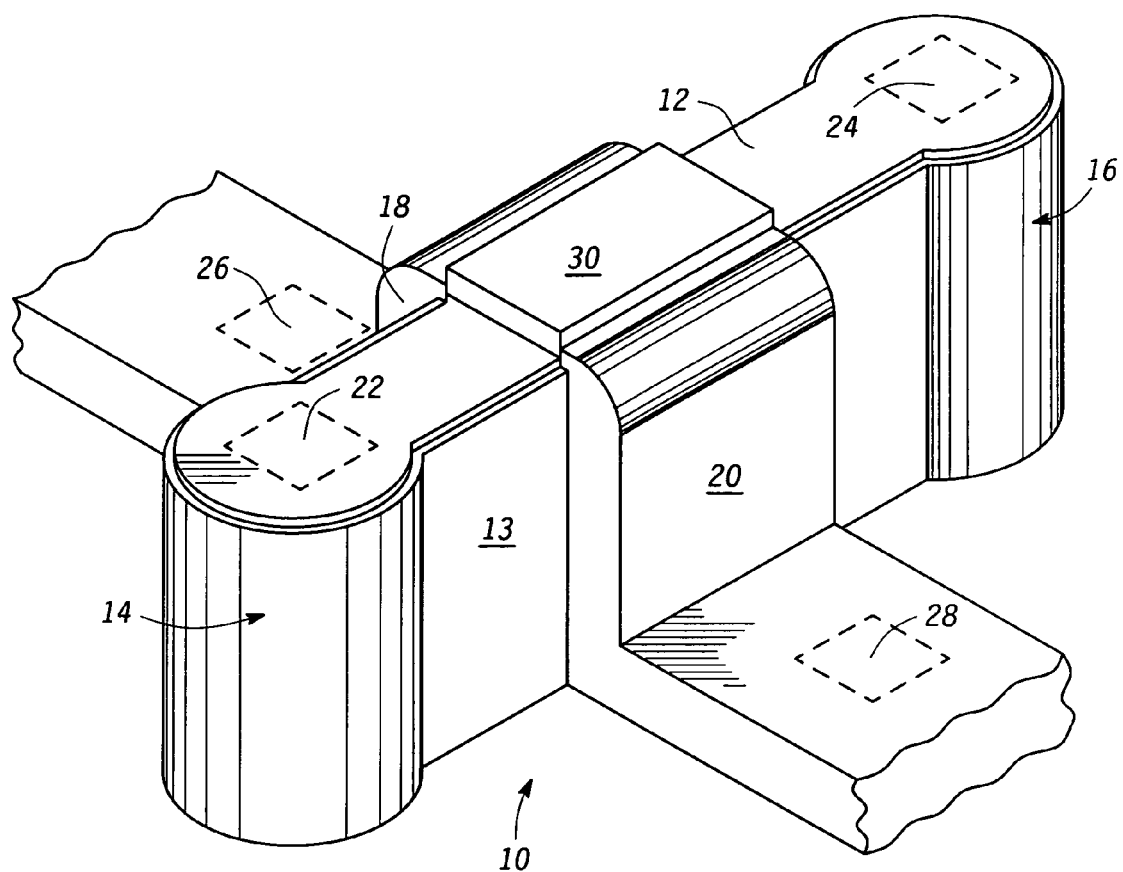
FIG. 1 is a partial isometric view of one embodiment of a multiple independent gate field-effect transistor (MIGFET).

FIG. 1 is a partial isometric view of one embodiment of a multiple independent gate field-effect transistor (MIGFET) 10 that can be used with the VCO 40 illustrated in FIG. 2 and described below. The MIGFET 10 includes a fin structure 12 formed over a substrate, for example a bulk substrate or silicon-on-insulator (SOI). The fin structure 12 is formed from a semiconductor material, has first and second sidewalls, and has a top surface a predetermined height above the surface of the substrate and. A dielectric layer 13 is formed over the surface of the substrate and over the first and second side walls as illustrated in FIG. 3. A layer of gate material is formed over the dielectric layer 13 as illustrated in FIG. 1 to form gate electrodes 18 and 20 on the first and second sides of the fin structure 12. Specifically, the gate material is formed over the substrate, the first sidewall of the fin to form a first gate 18, and the second sidewall of the fin to form a second gate 20. The first and second gates 18 and 20 have a predetermined height on the sidewalls of the fin structure 12, and are electrically isolated from each other. In one embodiment, the gate material may be deposited over the top of the fin structure, and then selectively removed to provide electrical isolation between the first and second gates 18 and 20. Fin structure 12 includes current terminal regions 14 and 16 located in each end of structure 12. In one embodiment where the resultant transistor structure is a field effect transistor (FET), regions 14 and 16 serve as the source and drain regions, respectively. Contacts 22, 24, 26, and 28 provide for electrical connection to the transistor 10. The contacts connect to metal layers implemented above the gate and the source/drain terminals (not shown). Note that in the illustrated embodiment, one contact is shown for each gate structure and source/drain connections; however, there may be any number of contacts as long as an acceptable electrical connection can be made. A nitride layer 30 is formed over the top surface of the fin structure 12. In other embodiments, nitride layer 30 may be made of other materials (e.g. other dielectrics).

During the operation of transistor structure 10, when a voltage is applied to one of the gates 18 and 20, a channel region is formed underneath the gate in the fin structure 12 providing a current path between the source and drain regions 14 and 16. Note that the channel regions may be undoped, doped to be N-type semiconductor, P-type semiconductor, or a combination of N-type and P-type semiconductor.

The illustrated embodiment discloses a multiple gate transistor structure having two independent gates. In other embodiments, a transistor structure may have more than two gate structures. For example, the transistor 10 may have an additional gate on top of the fin structure 12 in place of the nitride layer 30. Also, in other embodiments, multiple transistors 10 may be connected together in parallel if additional drive strength is required.

Figure 2:
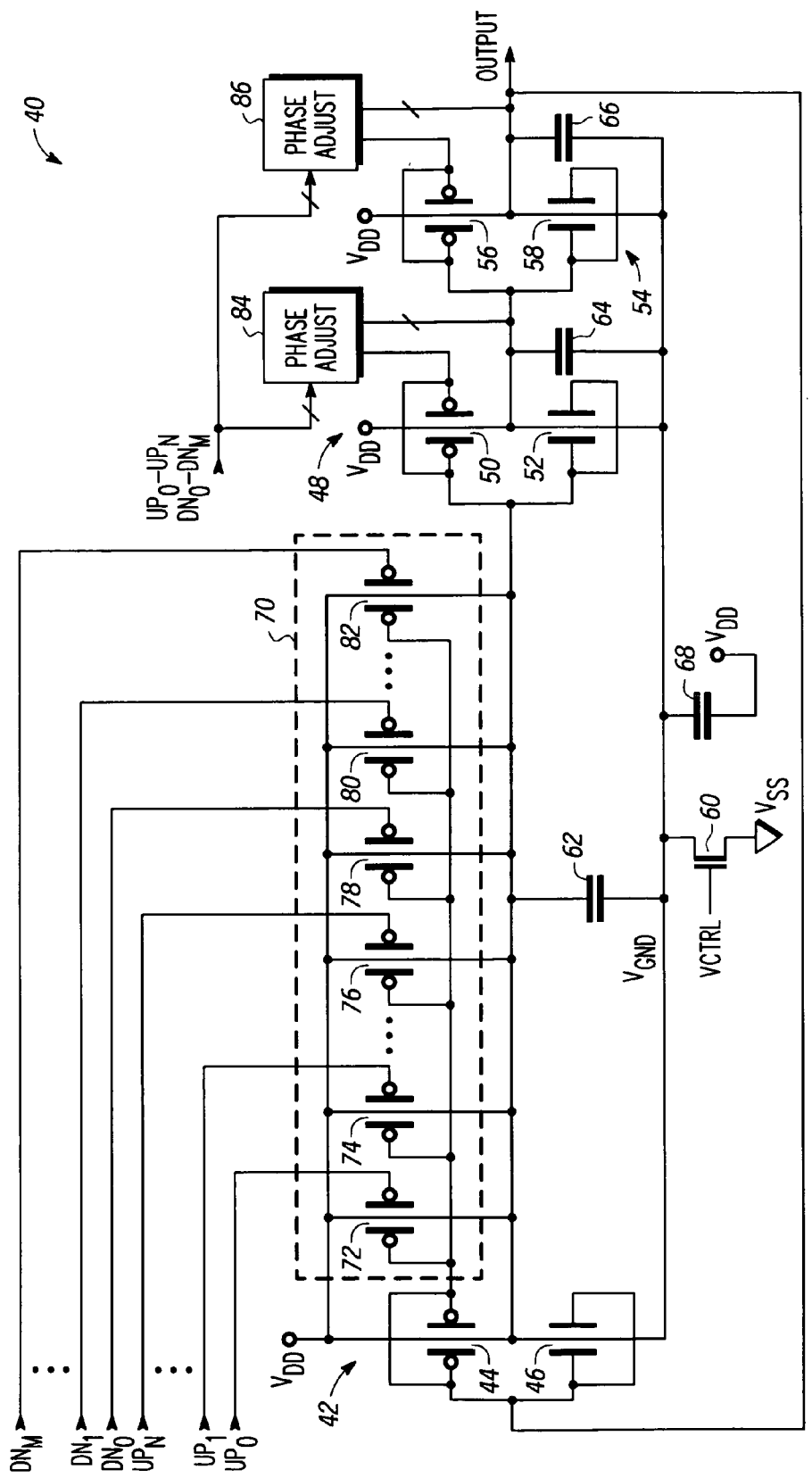
FIG. 2 illustrates, in schematic diagram form, a VCO in accordance with one embodiment of the present invention.
Figure 3:
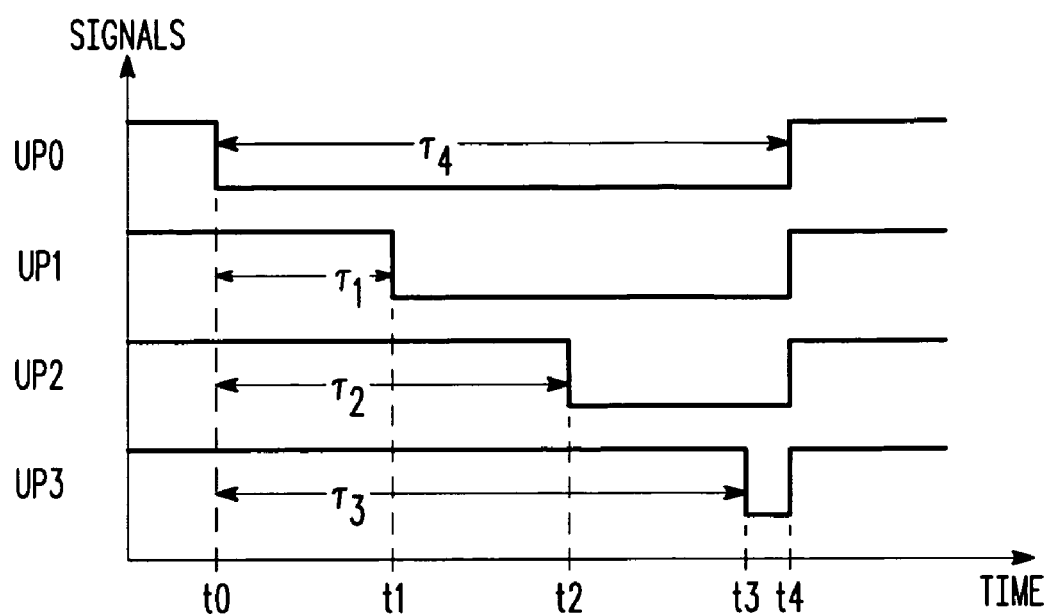
FIG. 3 is a timing diagram illustrating some of the phase adjustment signals of the VCO of FIG. 2.

FIG. 2 illustrates, in schematic diagram form, a VCO 40 in accordance with one embodiment of the present invention. VCO 40 includes inverters 42, 48, and 54, N-channel transistor 60, capacitors 62, 64, 66, and 68, and phase adjustment circuits 70, 84, and 86. Inverter 42 includes a P-channel MIGFET 44 and an N-channel MIGFET 46. Inverter 48 includes a P-channel MIGFET 50 and an N-channel MIGFET 52. Inverter 54 includes a P-channel MIGFET 56 and an N-channel MIGFET 58. Phase adjustment circuit 70 includes P-channel MIGFETs 72, 74, 76, 78, 80, and 82. An example of one MIGFET for use in VCO 10 is the MIGFET structure illustrated in FIG. 1. Note that the MIGFETs 72, 74, 76, 78, 80 and 82 of FIG. 2 function similarly to parallel-connected MOSFET transistors.

In FIG. 2, inverters 42, 48, and 54 are coupled together to form a ring oscillator, where an input of each inverter is coupled to an output of another one of the inverters. An output of the VCO can be provided at any point along the ring of inverters. For example, an output terminal labeled "OUTPUT" is provided at the output of inverter 54. Generally, a ring oscillator formed using inverters requires an odd number of inverters. The oscillating frequency of the ring oscillator is a function of the number of inverters. In the illustrated embodiment, three inverters are used. Each of inverters 42, 48, and 54 are formed using MIGFETs having their gates coupled together, and function as conventional inverting circuits where an input signal to a inverter is inverted and provided at the output of the inverter. In other embodiments, the inverters of the ring oscillator may be formed using other transistor types, for example, conventional CMOS transistors. Also, in other embodiments, the inverters of the ring oscillator may be replaced with another type of amplifier circuit. N-channel transistor 60 is coupled to provide a current source of each of the three inverters 42, 48, and 54. Transistor 60 is coupled between the source terminals of each of MIGFETs 46, 52, and 58 and a power supply voltage terminal labeled "VSS". A variable voltage control signal labeled "VCTRL" is provided to the gate of transistor 60 and is used to set the drain/source current of transistor 60, thus setting the operating frequency of VCO 40. Capacitors 62, 64, and 66 provide capacitive loads for each of the inverters and are coupled between the output side of each inverter and a virtual ground node labeled "VGND". Capacitor 68 functions as a conventional power supply decoupling capacitor coupled between a positive power supply terminal labeled "VDD" and source terminals of MIGFETs 46, 52, and 58.

Phase adjustment circuit 70 includes a first plurality of MIGFETs, represented by MIGFETS 72, 74, 76, for speeding up, or advancing, the phase of output signal OUTPUT in response to a speed-up control signal. Also, phase adjustment circuit 70 includes a second plurality of MIGFETS for slowing down, or retarding, the phase of the output signal OUTPUT in response to a slow-down control signal. In FIG. 2, each of the speed-up P-channel MIGFETs 72, 74 and 76 have a source connected to VDD, a drain connected to the output of inverter 42, a first gate connected to the input terminal of inverter 42, and a second gate for receiving one of speed-up control signals UP0, UP1, and UPN. The slow-down P-channel MIGFETs 78, 80, and 82 have a source connected to VDD, a drain connected to the output to inverter 42, a first gate connected to the input terminal of inverter 42, and a second gate for receiving one of slow-down control signals DN0, DN1 and DNM. Note that N and M are integers and may be equal to each other or different. Also, phase adjustment circuits 84 and 86 are identical to phase adjustment circuit 70.

Each of the plurality of MIGFETs making up the phase adjustment circuit have a first control electrode coupled to receive an input signal, a first portion of the plurality of multiple control electrode transistors having a second control electrode coupled to a respective one of a first plurality of digital control signals (DN0–DNM) which make the first portion of the plurality of multiple control electrode transistors conductive unless selectively made non-conductive. A second portion of the plurality of multiple control electrode transistors having a second control electrode coupled to a respective one of a second plurality of digital control signals (UP0–UPN) which make the second portion of the plurality of multiple gate transistors be non-conductive unless selectively made conductive. The first plurality and the second plurality of digital control signals for adjusting phase of the input signal.

During a steady state, no phase correction operation of VCO 10, speed-up control signals UP0 through UPN are each asserted as a logic high voltage and slow-down control signals DN0 through DNM are each asserted as a logic low voltage. Therefore, during the time when inverter 42 is pulling up the output of inverter 42, both gates of each of the MIGFETs 78, 80, and 82 are causing MIGFETs 78, 80, and 82 to be conductive and to pull up the output of inverter 42, and only one gate of MIGFETs 72, 74, and 76 are causing MIGFETs 72, 74, and 76 to be conductive to pull up the output of inverter 42.

Generally, a phase detection circuit is used in conjunction with the VCO to detect when VCO output clock signal is out of phase with a reference clock signal and whether the phase of the VCO output signal should be advanced or retarded with respect to the reference clock signal. In the case when the phase detection circuit detects an output of phase condition, the phase detection circuit will provide control signals to the phase adjustment circuit for correcting the phase of output clock signal. In the illustrated embodiment, if the phase of the output signal OUTPUT is detected as being out of phase with a reference signal (not shown), then a phase detection circuit (not shown) provides the speed-up control signals UP0 through UPN or the slow-down control signals DN0 through DNM as necessary to correct the phase of output signal OUTPUT. For example, in the case where the phase of output signal OUTPUT is detected as being behind the phase of a reference clock, then a phase detection circuit would assert one or more of speed-up control signals UP0 through UPN as a logic low voltage to add more pull-drive strength to the output of each of inverters 42, 48, and 54. Likewise, in the case where the phase of output signal OUTPUT is detected as being ahead of the phase of the reference clock, then the phase detection circuit would de-assert all of control signals UP0 to UPN to cause MIG- FETs 72, 74, and 76, respectively, to be substantially nonconductive and would de-assert one or more of slow-down control signals DN0 through DNM to further reduce the amount of pull-drive strength to the output of each of inverters 42, 48, and 54. Note that in the illustrated embodiment, all of phase adjustment circuits 70, 84, and 86 receive the same control signals from a phase detector. However, in other embodiments, the phase adjustment circuits 70, 84, and 86 may be controlled by separate control circuits. Also, the number of MIGFETs included in each of the phase adjustment circuits can be any number and is determined by how finely the phase should be corrected. Also, each of the MIGFETs of the phase connection circuits can be sized the same or sized differently. In addition, the MIGFETs may be used separately or in combination to provide a desired drive strength.

Note that in the illustrated embodiment, the inverters 42, 48, and 54 are formed from MIGFETs for various circuit considerations, such as for example, device operating characteristics, layout, and electrical property matching purposes. However, in other embodiments, the inverters may be formed from conventional metal oxide semiconductor field effect transistors (MOSFETs), or other transistor type.

FIG. 3 is a timing diagram illustrating control signal UP0–UP3 for one example of a phase adjustment circuit having four MIGFETs for speeding up the phase of an out-of-phase output signal OUTPUT. The illustrated speed-up control signals UP0 through UP3 are four control signals for controlling the gates four MIGFETs. In this case, the MIGFETs are turned on in steps. The phase detection circuit determines that all four MIGFETs are needed to speed-up the output signal OUTPUT of, for example, the VCO 40 of FIG. 2. Each of the four speed-up control signals are asserted sequentially as logic low signals. The first control signal UP0 is asserted as a logic low at time t0 and is de-asserted at time t4. The first control signal UP0 has a relatively wide pulse duration shown as t4. The next control signal, UP1, is asserted at time t1 after time t0 by a delay labeled "t1". The next control signal UP2 is asserted at time t2 after time t0 by a delay labeled "t2". Finally, the next signal UP3 is asserted at time t3 after time t0 by a delay labeled "t3". After time t4, all of the speed-up MIGFETs are turned off at the same time in response to the inverter input changing logic states. Note that in other embodiments, all of the necessary speed-up or slow-down control signals can be turned on, or off, simultaneously.

VCO 40 requires relatively less surface area of an integrated circuit, is simple, and is easy to implement. Also, as compared to prior art phase correction circuits, the disclosed VCO requires fewer conductors and fewer contacts, thus reducing resistance and simplifying the circuit. In addition, the phase adjustment circuits 70, 84, and 86 may provide a relatively greater range of phase correction.

While the invention has been described in the context of a preferred embodiment, it will be apparent to those skilled in the art that the present invention may be modified in numerous ways and may assume many embodiments other than that specifically set out and described above. For example, the conductivity types of the transistors may be reversed. If so, the phase adjustment circuit 70 would be connected with different conductivity type MIGFETs and be connected between the signal input (i.e. the OUTPUT) and $V_{GND}$ rather than $V_{DD}$. Additionally, a mix of MIGFETs of both conductivity types may be implemented with some connected between the signal input and $V_{GND}$ and the other MIGFETs connected between the signal input and $V_{DD}$.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A voltage controlled oscillator having digitally controlled phase adjustment comprising:
   means for providing a bias current or a bias voltage to the voltage controlled oscillator;
   a plurality of stages coupled to the means for providing a bias current or bias voltage, each of the plurality of stages inverting a signal to provide oscillation; and
   a phase adjusting circuit coupled to at least one of the plurality of stages, the phase adjusting circuit comprising a plurality of transistors with multiple control electrodes and coupled to an output of the at least one of the plurality of stages, each of the plurality of multiple control electrode transistors having a first control electrode coupled to a same control signal, a first portion of the plurality of multiple control electrode transistors having a second control electrode coupled to a respective one of a first plurality of digital control signals which make the first portion of the plurality of multiple control electrode transistors conductive unless selectively made non-conductive, a second portion of the plurality of multiple control electrode transistors having a second control electrode coupled to a respective one of a second plurality of digital control signals which make the second portion of the plurality of multiple control electrode transistors be non-conductive unless selectively made conductive, the first plurality and the second plurality of digital control signals adjusting phase of the signal.

2. The voltage controlled oscillator of claim 1 wherein each of the plurality of stages comprises either an inverter or an amplifier circuit.

3. The voltage controlled oscillator of claim 2 wherein each of the plurality of stages comprises an inverter comprising a first multiple control electrode transistor of a first conductivity type coupled in series with a second multiple control electrode transistor of a second conductivity type opposite the first conductivity type.

4. The voltage controlled oscillator of claim 1 wherein the phase adjusting circuit is coupled to each of the plurality of stages.

5. The voltage controlled oscillator of claim 1 wherein the plurality of multiple control electrode transistors comprise a plurality of multiple independent gate field effect transistors (MIGFETs).

6. The voltage controlled oscillator of claim 1 wherein each transistor of the first portion of the plurality of multiple control electrode transistors comprises a first current electrode coupled to a supply voltage terminal, a first control electrode coupled to the same control signal, a second control electrode coupled to the respective one of the digital control signals, and a second current electrode coupled to the output of the at least one of the plurality of stages, each transistor of the first portion of the plurality of multiple control electrode transistors being of a first conductivity type; and wherein each of the plurality of stages comprises a first multiple control electrode transistor of the first conductivity type having a first current electrode coupled to the supply voltage terminal, a second current electrode coupled to the output of the respective one of the plurality of stages, and a second multiple control electrode transistor of a second conductivity type opposite the first conductivity type, the second multiple control electrode transistor comprising a first current electrode coupled to the second current electrode of the first multiple control electrode transistor, a second current electrode coupled to a reference voltage node, control electrodes of the first multiple control electrode transistor and the second multiple control electrode transistor being connected together to an input of the respective one of the plurality of stages.

7. The voltage controlled oscillator of claim 1 further comprising:

a load capacitor within each of the plurality of stages, the load capacitor comprising a first electrode coupled to the plurality of multiple control electrode transistors and a second electrode coupled to a reference voltage terminal; and a decoupling capacitor having a first electrode coupled to a power supply voltage terminal and a second electrode coupled to the reference voltage terminal.

8. A voltage controlled oscillator having digitally controlled phase adjustment comprising:

a first inverting stage for receiving a signal at an input and providing a first inversion of the signal and at an output thereof;

a second inverting stage for receiving the first inversion of the signal at an input and providing a second inversion of the signal at an output thereof;

circuitry for coupling the output of the second inverting stage to the input of the first inverting stage; and phase adjusting circuitry coupled to the output of the first inverting stage, the phase adjusting circuitry comprising:

a plurality of transistors, each with multiple control electrodes, each of the plurality of transistors being coupled between a supply voltage terminal and the output of the first inverting stage, each of the plurality of multiple control electrode transistors having a first control electrode coupled to a same control signal, a first portion of the plurality of multiple control electrode transistors having a second control electrode coupled to a respective one of a first plurality of digital control signals which make the first portion of the plurality of multiple control electrode transistors conductive unless selectively made non-conductive, a second portion of the plurality of multiple control electrode transistors having a second control electrode coupled to a respective one of a second plurality of digital control signals which make the second portion of the plurality of multiple gate transistors be non-conductive unless selectively made conductive, the first plurality and the second plurality of digital control signals adjusting phase of the signal.

9. The voltage controlled oscillator of claim 8 wherein the same control signal comprises an input of the first inverting stage.

10. The voltage controlled oscillator of claim 8 wherein the phase adjusting circuitry further comprises:

a second plurality of transistors, each with multiple control electrodes, each of the second plurality of transistors being coupled between a supply voltage terminal and the output of the second inverting stage, each of the plurality of multiple control electrode transistors having a first control electrode coupled to a same control signal, a first portion of the plurality of multiple control electrode transistors having a second control electrode coupled to a respective one of a third plurality of digital control signals which make the first portion of the plurality of multiple control electrode transistors conductive unless selectively de-asserted, a second portion of the second plurality of transistors having a second control electrode coupled to a respective one of a fourth plurality of digital control signals which make the second portion of the plurality of multiple control electrode transistors be non-conductive unless selectively asserted, the third plurality and the fourth plurality of digital control signals further adjusting phase of the signal.

11. The voltage controlled oscillator of claim 8 wherein each of the plurality of transistors comprises a transistor having physically separate and independent gates.

12. The voltage controlled oscillator of claim 8 wherein each of the first inverting stage and the second inverting stage are formed of transistors with multiple control electrodes to match device operating characteristics of the plurality of transistors of the phase adjusting circuitry.

13. The voltage controlled oscillator of claim 8 further comprising:

means for providing a bias current or bias voltage to each of the first inverting stage and the second inverting stage, the means for providing being selectively enabled to permit biasing of the first inverting stage and the second inverting stage and enable the voltage controlled oscillator.

14. The voltage controlled oscillator of claim 8 further comprising one or more additional inverting stages coupled to the output of the second inverting stage wherein the circuitry coupling an output of a last one of the one or more additional inverting stages to the input of the first inverting stage.

15. A method of controlling an oscillator comprising:
providing a bias current or a bias voltage;
coupling a plurality of inverting stages to the bias current or bias voltage, each of the plurality of inverting stages inverting a signal to provide oscillation; and
phase adjusting the signal by coupling a plurality of transistors with multiple control electrodes to an output of at least one of the plurality of inverting stages, each of the plurality of multiple control electrode transistors having a first control electrode coupled to an input of the at least one of the plurality of inverting stages, a first portion of the plurality of multiple control electrode transistors having a second control electrode coupled to a respective one of a first plurality of digital control signals which makes the first portion of the plurality of multiple control electrode transistors conductive unless selectively made non-conductive, a second portion of the plurality of multiple control electrode transistors having a second control electrode coupled to a respective one of a second plurality of digital control signals which makes the second portion of the plurality of multiple control electrode transistors be non-conductive unless selectively made conductive, the first plurality and the second plurality of digital control signals adjusting phase of the signal.

16. The method of claim 15 further comprising:
coupling a separate plurality of transistors with multiple control electrodes to an output of all of the plurality of inverting stages, each of the plurality of inverting stages separately adjusting phase of the signal in the oscillator.

17. The method of claim 15 further comprising:
implementing the plurality of inverting stages with transistors having multiple control electrodes.

18. The method of claim 17 further comprising using a same type of multiple control electrode transistor in the plurality of inverting stages and the plurality of transistors with multiple control electrodes for matching device performance.

19. The method of claim 15 further comprising:
during operation of the oscillator making a predetermined portion of the plurality of transistors with multiple control electrode conductive to either source or sink current to the output of the at least one of the inverting stages.

20. The method of claim 15 further comprising:
selectively asserting or de-asserting the first plurality of control signals and second plurality of control signals in a sequential order.

* * * * *